United States Patent [19]
Jang et al.

[11] Patent Number: 5,563,104
[45] Date of Patent: Oct. 8, 1996

[54] REDUCTION OF PATTERN SENSITIVITY IN OZONE-TEOS DEPOSITION VIA A TWO-STEP (LOW AND HIGH TEMPERATURE) PROCESS

[75] Inventors: Syun-Ming Jang, Hsin-Chu; Lu-Min Liu, Hsinchu Hsien, both of Taiwan

[73] Assignee: Taiwan Semiconductor Manufacturing Company Ltd., Hsinchu, Taiwan

[21] Appl. No.: 494,629

[22] Filed: Jun. 23, 1995

[51] Int. Cl.$^6$ .................................................. H01L 21/316
[52] U.S. Cl. .......................... 437/235; 437/238; 437/978
[58] Field of Search .................................. 437/235, 238, 437/978, 228

[56] References Cited

U.S. PATENT DOCUMENTS

| | | | |
|---|---|---|---|
| 4,872,947 | 10/1989 | Wang et al. | 156/643 |
| 5,271,972 | 12/1993 | Kwok et al. | 427/579 |
| 5,356,722 | 10/1994 | Nguyen et al. | 427/569 |
| 5,376,590 | 12/1994 | Machida et al. | 437/235 |
| 5,387,546 | 2/1995 | Maeda et al. | 437/174 |
| 5,424,253 | 6/1995 | Usami et al. | 437/238 |
| 5,459,105 | 10/1995 | Matsuura | 437/228 |
| 5,518,962 | 5/1996 | Murao | 437/238 |
| 5,525,551 | 6/1996 | Ohta | 437/238 |

OTHER PUBLICATIONS

Wolf, Stanley, "Si Proc for the VLSI Era" vol. 2, (1990) p. 194.

*Primary Examiner*—Robert Konemund
*Assistant Examiner*—Matthew Whipple
*Attorney, Agent, or Firm*—George O. Saile; Rosemary L. S. Pike

[57] ABSTRACT

An improved method of ozone-TEOS deposition with reduced pattern sensitivity using a two-step low and high temperature process is described. Semiconductor device structures are provided in and on a semiconductor substrate. A conducting layer is deposited overlying the surfaces of the semiconductor device structures and patterned to form conducting lines. An underlayer is deposited overlying the patterned conducting layer. A dielectric layer is deposited in two steps. A first ozone-TEOS layer is deposited over the surfaces of the conducting layer at a first temperature to a first thickness. A second ozone-TEOS layer is deposited over the first ozone-TEOS layer at a second temperature and to a second thickness wherein the second temperature is higher than the first temperature and the second thickness is greater than the first thickness completing the dielectric layer.

26 Claims, 1 Drawing Sheet

REDUCTION OF PATTERN SENSITIVITY IN OZONE-TEOS DEPOSITION VIA A TWO-STEP (LOW AND HIGH TEMPERATURE) PROCESS

RELATED PATENT APPLICATION

1) Co-pending U.S. patent application Ser. No. 08/494,630 (TS94-098) filed on Jun. 23, 1995 to S. M. Jang et al.

BACKGROUND OF THE INVENTION (1) Field of the Invention

The present invention relates to the fabrication of integrated circuit devices, and more particularly, to a method of reducing the pattern sensitivity of an ozone-TEOS dielectric layer in the fabrication of integrated circuits.

(2) Description of the Prior Art

In the fabrication of integrated circuits, a conducting layer is deposited over a semiconductor substrate containing semiconductor device structures such as gate electrodes and source and drain regions. The conducting layer is patterned to form conducting lines. A dielectric layer is deposited over the conducting lines and within the gaps between conducting lines. Typically, the dielectric layer is composed of ozone-TEOS (tetraethoxysilane).

Pattern sensitivity has been found to be a severe problem in ozone-TEOS deposition. The phenomenon has been that ozone-TEOS deposits slower in areas overlying dense metals. This can lead to problems such as voids within the dielectric layer. We have found that the degree of pattern sensitivity depends strongly on deposition temperature. However, the quality of the ozone-TEOS layer degrades at reduced temperatures. It is desired to find a method of forming a high quality ozone-TEOS layer with reduced pattern sensitivity.

U.S. Pat. No. 5,271,972 to Kwok et al teaches the deposition of an ozone-TEOS layer with power ramp down during the last few seconds. U.S. Pat. No. 5,356,722 to Nguyen et al teaches the use of a plasma enhanced seed oxide consisting of a plasma, TEOS, and a nitrogen-containing gas. Co-pending U.S. patent application Ser. No. 08/494,630 to the same inventors teaches a method of reducing pattern sensitivity by using an underlayer of PE-SiH$_4$ or PE-SiN.

SUMMARY OF THE INVENTION

Accordingly, it is a primary object of the invention to provide a process for reducing the pattern sensitivity in ozone-TEOS deposition in the fabrication of integrated circuits.

It is a further object of the invention to provide a two-step deposition process for ozone-TEOS that will reduce pattern sensitivity and maintain ozone-TEOS quality.

In accordance with the objects of the invention, an improved method of ozone-TEOS deposition with reduced pattern sensitivity using a two-step low and high temperature process is achieved. Semiconductor device structures are provided in and on a semiconductor substrate. A conducting layer is deposited overlying the surfaces of the semiconductor device structures and patterned to form conducting lines. An underlayer is deposited overlying the patterned conducting layer. A dielectric layer is deposited in two steps. A first ozone-TEOS layer is deposited over the surfaces of the conducting layer at a first temperature to a first thickness. A second ozone-TEOS layer is deposited over the first ozone-TEOS layer at a second temperature and to a second thickness wherein the second temperature is higher than the first temperature and the second thickness is greater than the first thickness completing the dielectric layer.

BRIEF DESCRIPTION OF THE DRAWINGS

In the accompanying drawings forming a material part of this description, there is shown.

DESCRIPTION OF THE PREFERRED EMBODIMENTS

Figure 1:
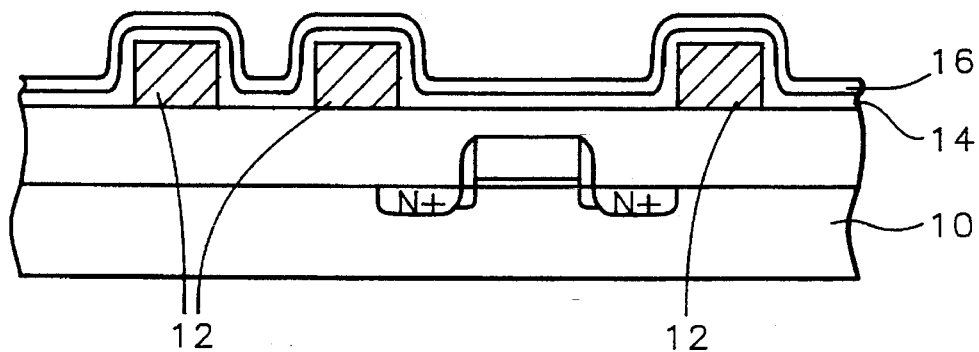
FIGS. 1 and 2 are cross-sectional representations of a preferred embodiment of the present invention.

Referring now more particularly to FIG. 1, there is shown a semiconductor substrate 10, in which may be formed semiconductor device structures which may include polysilicon gate electrodes and source and drain regions. A layer of conducting material 12 has been deposited over the surface of the semiconductor substrate and patterned. The surface may be planarized, as shown, or not. The conducting material may be metal, such as TiN/AlCu(Si)/TiN or Ti/TiN/AlCu(Si)/TiN, or the like.

A nucleation layer 14 of silicon oxide or TEOS oxide is deposited by plasma enhanced chemical vapor deposition (PECVD) over the surface of the patterned conducting layer. This layer is deposited at a temperature of between about 380° to 420° C. such that surface sensitivity is eliminated. That is, the surface seen by the subsequent ozone-TEOS layer is a consistent underlayer rather than different materials. The underlayer 14 is typically between about 1000 to 2000 Angstroms in thickness.

Next, a first layer of ozone-TEOS 16 is deposited overlying the nucleation layer at a low temperature of between about 350° to 370° C. to a thickness of between about 500 to 2000 Angstroms. This first layer of ozone-TEOS deposited at low temperature eliminates the pattern sensitivity.

Figure 2:
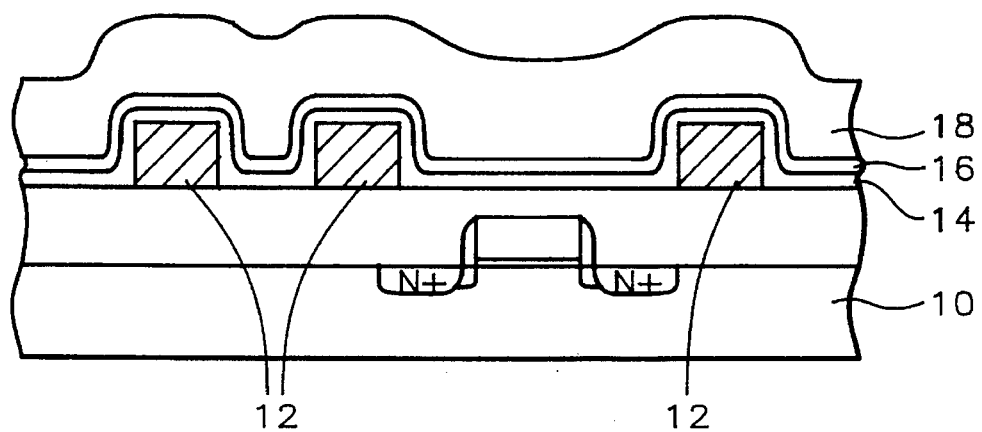

Referring now to FIG. 2, a second layer of ozone-TEOS 18 is deposited at a high temperature of between about 430° to 450° C. to a thickness of between about 3000 to 4500 Angstroms. The higher temperature of this deposition yields a higher quality oxide. The pattern sensitivity is reduced by the low temperature first ozone-TEOS layer and the quality of the dielectric is improved by the high temperature second ozone-TEOS layer.

It has been found that oxide film thickness is dependent upon the deposition rate times the deposition time minus the delay time before deposition begins; that is, the incubation time. The process of the invention reduces the pattern dependence upon the incubation time.

EXAMPLE

The following example is given to show the important features of the invention and to aid in the understanding thereof. Variations may be made by one skilled in the art without departing from the spirit and scope of the invention.

In an experiment, ozone-TEOS was deposited by subatmospheric chemical vapor deposition over a PE-TEOS or PE-OX nucleation layer on a metal patterned wafer to a thickness of 5000 Angstroms. The deposition temperature was varied from 360° to 440° C. The following table shows the incubation time (that is, the delay before deposition began) for each deposition temperature. Also shown in the last column is the ratio of the thickness difference between the sparse metal areas (26 in FIG. 2) and the dense metal areas (24 in FIG. 2) to the average thickness; that is, the pattern sensitivity.

TABLE 1

| Deposition temp (°C.) | Incubation time (sec) | T (sparse)–T (dense) % average |
|---|---|---|
| 360 | 2.8 | 4.8 |
| 380 | 8.3 | — |
| 400 | 19 | 10 |
| 420 | 33 | — |
| 440 | 49 | 24 |

As the incubation time is decreased, its variation with metal density is reduced. That helps us remove the incubation time factor in pattern sensitivity. For example, the difference of incubation time for 360° and 440° C. depositions is 46 seconds. Though the two-step process of the present invention introduces a second incubation time for the ozone-TEOS on ozone-TEOS; i.e. 15 seconds at 440° C., the total incubation time is still much lower compared to the one-step process at 440° C. It is not clear why incubation time varies with metal density, but it has been shown that reducing incubation time decreases pattern sensitivity.

It can be seen from Table 2 that the wet etch rate of an ozone-TEOS film deposited at a higher temperature is slower than that of an ozone-TEOS film deposited at a lower temperature. The etch rate is indicative of film quality. A slower etch rate indicates a higher quality silicon oxide film.

TABLE 2

| Deposition temp (°C.) | Wet etch rate (A/min) |
|---|---|
| 360 | 9522 |
| 380 | 6718 |
| 400 | 4389 |
| 420 | 3986 |
| 440 | 3660 |

While the invention has been particularly shown and described with reference to the preferred embodiments thereof, it will be understood by those skilled in the art that various changes in form and details may be made without departing from the spirit and scope of the invention.

What is claimed is:

1. A method of manufacturing an integrated circuit comprising:

providing semiconductor device structures in and on a semiconductor substrate;

depositing a conducting layer overlying the surfaces of said semiconductor device structures and patterning said conducting layer to form conducting lines;

depositing a dielectric layer comprising:
conformally depositing a first oxide layer over the surfaces of said conducting layer wherein said first oxide layer comprises subatmospheric chemically vapor deposited ozone-TEOS and is deposited at a first temperature of between about 350° to 370° C. and to a first thickness; and
depositing a second oxide layer over said first oxide layer wherein said second oxide layer is deposited at a second temperature of between about 430° to 450° C. and to a second thickness wherein said second thickness is greater than said first thickness to complete said dielectric layer; and completing the fabrication of said integrated circuit.

2. A method according to claim 1 wherein said depositing said dielectric layer further comprises depositing a nucleation layer underlying said first oxide layer and overlying said patterned conducting layer.

3. A method according to claim 2 wherein said nucleation layer comprises plasma enhanced chemical vapor deposited silicon oxide.

4. A method according to claim 2 wherein said nucleation layer comprises plasma enhanced chemical vapor deposited TEOS oxide.

5. A method according to claim 1 wherein said first thickness is between about 500 to 2000 Angstroms.

6. A method according to claim 1 wherein said second oxide layer comprises subatmospheric chemically vapor deposited ozone-TEOS.

7. A method according to claim 1 wherein said second thickness is between about 3000 to 4500 Angstroms.

8. A method according to claim 1 wherein the sum of said first and second thicknesses is more than about 4000 Angstroms.

9. A method according to claim 1 wherein said first oxide deposited at said first temperature reduces the pattern sensitivity of said second oxide deposition.

10. A method according to claim 1 wherein said second oxide deposited at said second temperature increases the quality of said dielectric layer.

11. A method of manufacturing an integrated circuit comprising:

providing semiconductor device structures in and on a semiconductor substrate;

depositing a conducting layer overlying the surfaces of said semiconductor device structures and patterning said conducting layer to form conducting lines;

depositing a dielectric layer comprising:
depositing a nucleation layer over the surfaces of said conducting layer;
depositing a first oxide layer overlying said nucleation layer wherein said first oxide layer comprises subatmospheric chemically vapor deposited ozone-TEOS and is deposited at a first temperature of between about 350°–370° C. to a first thickness; and
depositing a second oxide layer over said first oxide layer wherein said second oxide layer is deposited at a second temperature of between about 430° to 450° C. and to a second thickness wherein said second thickness is greater than said first thickness to complete said dielectric layer; and completing the fabrication of said integrated circuit.

12. A method according to claim 11 wherein said nucleation layer comprises plasma enhanced chemical vapor deposited silicon oxide.

13. A method according to claim 11 wherein said nucleation layer comprises plasma enhanced chemical vapor deposited TEOS oxide.

14. A method according to claim 11 wherein said first thickness is between about 500 to 2000 Angstroms.

15. A method according to claim 11 wherein said second oxide layer comprises subatmospheric chemically vapor deposited ozone-TEOS.

16. A method according to claim 11 wherein said second thickness is between about 3000 to 4500 Angstroms.

17. A method according to claim 11 wherein the sum of said first and second thicknesses is more than about 4000 Angstroms.

18. A method according to claim 11 wherein said first oxide deposited at said first temperature reduces the pattern sensitivity of said second oxide deposition.

19. A method according to claim 11 wherein said second oxide deposited at said second temperature increases the quality of said dielectric layer.

20. A method of manufacturing an integrated circuit comprising:

providing semiconductor device structures in and on a semiconductor substrate;

depositing a conducting layer overlying the surfaces of said semiconductor device structures and patterning said conducting layer to form conducting lines;

depositing a dielectric layer comprising:

depositing a nucleation layer over the surfaces of said conducting layer;

depositing a first oxide layer overlying said nucleation layer wherein said first oxide layer comprises subatmospheric chemically vapor deposited ozone-TEOS and is deposited at a temperature of between about 350° to 370° C. to a first thickness; and depositing a second oxide layer over said first oxide layer wherein said second oxide layer is deposited at a temperature of between about 430° to 450° C. wherein the presence of said first oxide layer reduces the pattern sensitivity of said second oxide deposition and wherein said second oxide layer is deposited to a second thickness wherein said second thickness is greater than said first thickness to increase the quality of said dielectric layer; and completing the fabrication of said integrated circuit.

21. A method according to claim 20 wherein said nucleation layer comprises plasma enhanced chemical vapor deposited silicon oxide.

22. A method according to claim 20 wherein said nucleation layer comprises plasma enhanced chemical vapor deposited TEOS oxide.

23. A method according to claim 20 wherein said first thickness is between about 500 to 2000 Angstroms.

24. A method according to claim 20 wherein said second oxide layer comprises subatmospheric chemically vapor deposited ozone-TEOS.

25. A method according to claim 20 wherein said second thickness is between about 3000 to 4500 Angstroms.

26. A method according to claim 20 wherein the sum of said first and second thicknesses is more than about 4000 Angstroms.

* * * * *